United States Patent
Kurobe et al.

(10) Patent No.: US 10,554,013 B2
(45) Date of Patent: Feb. 4, 2020

(54) SEMICONDUCTOR LASER APPARATUS

(71) Applicant: FURUKAWA ELECTRIC CO., LTD., Tokyo (JP)

(72) Inventors: Tatsuro Kurobe, Tokyo (JP); Toshihito Suzuki, Tokyo (JP); Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/420,601

(22) Filed: Jan. 31, 2017

(65) Prior Publication Data

US 2017/0141532 A1  May 18, 2017

Related U.S. Application Data

(63) Continuation of application No. PCT/JP2016/054090, filed on Feb. 12, 2016.

(30) Foreign Application Priority Data

Feb. 12, 2015  (JP) .................................. 2015-025841

(51) Int. Cl.
   *H01S 5/026*   (2006.01)
   *H01S 5/022*   (2006.01)
   *H01S 5/40*    (2006.01)

(52) U.S. Cl.
   CPC .......... *H01S 5/026* (2013.01); *H01S 5/02284* (2013.01); *H01S 5/02288* (2013.01); *H01S 5/4012* (2013.01); *H01S 5/4025* (2013.01)

(58) Field of Classification Search
   CPC .... H01S 5/026; H01S 5/4012; H01S 5/02284; H01S 5/4025; H01S 5/02288
   See application file for complete search history.

(56) References Cited

U.S. PATENT DOCUMENTS

| 2004/0151432 A1* | 8/2004 | Tabuchi | G02B 6/12011 385/37 |
| 2005/0013330 A1* | 1/2005 | Kish, Jr. | B82Y 20/00 372/26 |

(Continued)

FOREIGN PATENT DOCUMENTS

| CN | 102362400 A | 2/2012 |
| JP | 2002-232069 | 8/2002 |

(Continued)

OTHER PUBLICATIONS

International Search Report dated May 10, 2016 in PCT/JP2016/054090, filed on Feb. 12, 2016.

(Continued)

*Primary Examiner* — Yuanda Zhang
(74) *Attorney, Agent, or Firm* — Oblon, McClelland, Maier & Neustadt, L.L.P.

(57) ABSTRACT

A semiconductor laser apparatus includes a semiconductor optical integrated device including a semiconductor laser array including a plurality of semiconductor laser elements, a semiconductor arrayed waveguide grating, made of a semiconductor, including an inputting slab waveguide connected to the plurality of the semiconductor laser elements, an array waveguide connected to the inputting slab waveguide and including a plurality of waveguides having different lengths from each other and arranged in a parallel manner, and an outputting slab waveguide connected to the array waveguide; a substrate on which the semiconductor laser array and the semiconductor arrayed waveguide grating are monolithically integrated; and an output facet outputting a laser light emitted from the semiconductor laser elements and including an output end of the outputting slab waveguide.

13 Claims, 10 Drawing Sheets

(56) References Cited

U.S. PATENT DOCUMENTS

| | | | | |
|---|---|---|---|---|
| 2005/0201675 A1* | 9/2005 | Knopp | ............... | G02B 6/12 |
| | | | | 385/27 |
| 2007/0223552 A1* | 9/2007 | Muendel | ........... | G02B 6/12004 |
| | | | | 372/50.12 |
| 2009/0153949 A1* | 6/2009 | Kanemoto | ........... | G02B 6/4201 |
| | | | | 359/333 |
| 2011/0310916 A1* | 12/2011 | Kimoto | ............... | G02B 6/2808 |
| | | | | 372/20 |

FOREIGN PATENT DOCUMENTS

| | | |
|---|---|---|
| JP | 2003-14963 | 1/2003 |
| JP | 2005-317695 | 11/2005 |
| JP | 2008-103766 | 5/2008 |
| JP | 2008-282937 | 11/2008 |
| JP | 2010-177221 | 8/2010 |
| JP | 2011-233829 | 11/2011 |
| JP | 2012-242654 | 12/2012 |

OTHER PUBLICATIONS

Written Opinion dated May 10, 2016 in PCT/JP2016/054090, filed on Feb. 12, 2016.
Office Action and Search Report dated Mar. 7, 2019 in the corresponding Chinese Patent Application No. 201680001891.X (with unedited computer generated English Translation and Translation of Category of Cited Documents) 19 pages.

* cited by examiner

POSITION IN LAYER SURFACE DIRECTION [μm]

POSITION IN LAYER DIRECTION [μm]

SEMICONDUCTOR LASER APPARATUS

CROSS-REFERENCE TO RELATED APPLICATION(S)

This application is a continuation of International Application No. PCT/JP2016/054090, filed on Feb. 12, 2016 which claims the benefit of priority of the prior Japanese Patent Application No. 2015-025841, filed on Feb. 12, 2015, the entire contents of which are incorporated herein by reference.

BACKGROUND

The present disclosure relates to a semiconductor laser apparatus.

For example, as a wavelength-tunable light source for Dense Wavelength Division. Multiplexing (DWDM) optical communications, an integrated wavelength-tunable laser element has been disclosed (see, for example, Japanese Laid-open Patent Publication No. 2005-317695 and Japanese Laid-open Patent Publication No. 2008-103766). Japanese Laid-open Patent Publication No. 2005-317695 discloses a wavelength-tunable laser element in which a semiconductor laser array including a plurality of Distributed Feedback (DFB) semiconductor laser elements having different laser emission wavelengths, a Multi Mode Interferometer (MMI) optical coupler, and a Semiconductor Optical Amplifier (SOA) are integrated on a substrate.

When the optical coupler connected to the semiconductor laser array described above does not have wavelength selectivity, the output optical intensity of the light output from the wavelength-tunable laser element is lower than or equal to the output optical intensity of the light output from the semiconductor laser array divided by the number of the semiconductor elements. This increases a loss of the light output from the wavelength-tunable laser element.

In light of the foregoing, to reduce the loss and increase the output efficiency of the element, a wavelength-tunable laser element using an Arrayed Waveguide Grating (AWG) including a semiconductor as an optical coupler is disclosed (see, for example, Japanese Laid-open Patent Publication No. 2008-282937). The AWG includes an inputting slab waveguide, an array waveguide, and an outputting slab waveguide, and an output waveguide is connected to the outputting slab waveguide.

However, when there is a manufacturing error in the AWG, the output position of the AWG changes. due to the change the coupling loss between the AWG and the output waveguide may be increased, and thus the output of the element may be significantly reduced. In other words, in the wavelength-tunable laser element including an output waveguide connected to the outputting slab waveguide, the tolerance to the manufacturing error is small. Especially, the refractive index of the semiconductor material used in the semiconductor laser element is significantly greater than that of a fused quartz-based material. Thus, the tolerance to the manufacturing error of the semiconductor material-based AWG is drastically lower than that of a fused quartz-based AWG. This is a great disadvantage.

SUMMARY

According to an embodiment of the present disclosure, a semiconductor laser apparatus includes a semiconductor optical integrated device including a semiconductor laser array including a plurality of semiconductor laser elements, a semiconductor arrayed waveguide grating, made of a semiconductor, including an inputting slab waveguide connected to the plurality of the semiconductor laser elements, an array waveguide connected to the inputting slab waveguide and including a plurality of waveguides having different lengths from each other and arranged in a parallel manner, and an outputting slab waveguide connected to the array waveguide; a substrate on which the semiconductor laser array and the semiconductor arrayed waveguide grating are monolithically integrated; and an output facet outputting a laser light emitted from the semiconductor laser elements and including an output end of the outputting slab waveguide.

The above and other objects, features, advantages and technical and industrial significance of this disclosure will be better understood by reading the following detailed description of presently preferred embodiments of the invention, when considered in connection with the accompanying drawings.

DETAILED DESCRIPTION

Figure 1:
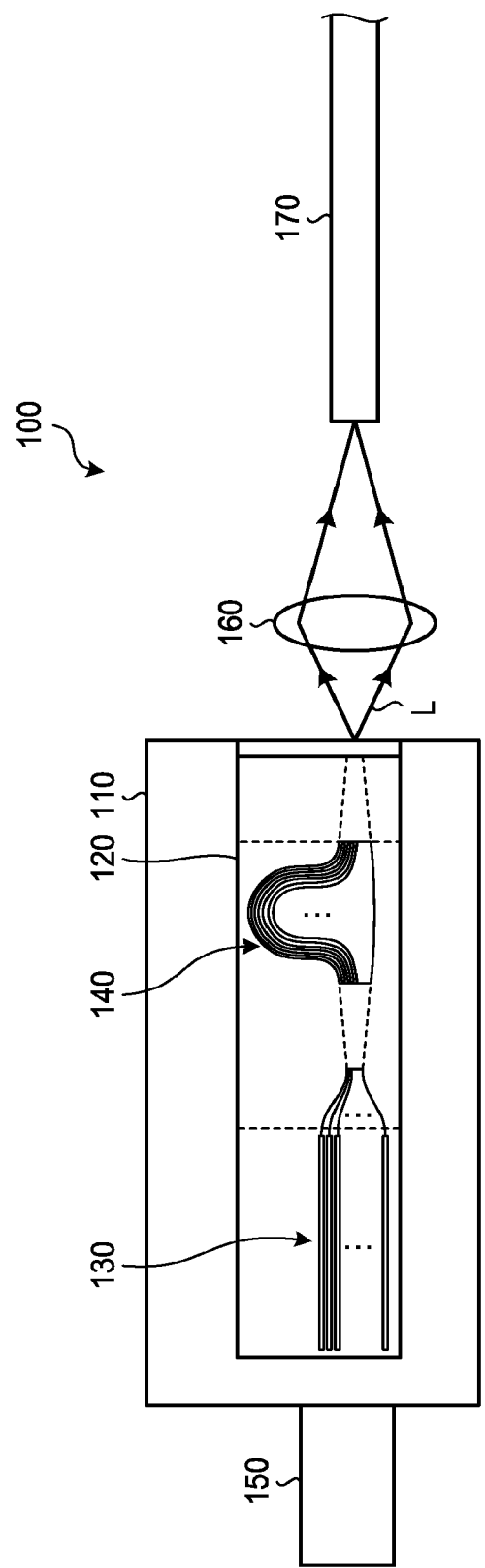
FIG. 1 is a schematic top view of a semiconductor laser apparatus according to a first embodiment.

The embodiments of a semiconductor laser apparatus according to the present disclosure will be described below with reference to the accompanying drawings. Note that the present disclosure is not limited to the embodiments. In the drawings, the same reference signs are used to describe the same or corresponding components. Note that the drawings may be schematic and the dimensional relationships and ratios of the components may be different from the actual dimensional relationships and ratios. Among the drawings, some parts may be illustrated in different relationships or different ratios in the dimensions.

First Embodiment

First, a semiconductor laser apparatus according to a first embodiment of the present disclosure will be described. FIG. 1 is a schematic top view of a semiconductor laser apparatus according to the first embodiment. As illustrated in FIG. 1, a semiconductor laser apparatus 100 includes a semiconductor optical integrated device 120 placed on a Thermo Electric Cooler (TEC) 110. On the semiconductor optical integrated device 120 are integrated a DFB laser array 130 as a semiconductor laser array, and an AWG 140 as a semiconductor arrayed waveguide grating. Furthermore, the semiconductor laser apparatus 100 includes a light detector 150, a lens 160 as a first lens, and an optical fiber 170.

The TEC 110 is, for example, a Peltier device so as to control the temperature of the placed semiconductor optical integrated device 120 at a predetermined temperature.

The semiconductor optical integrated device 120 is a semiconductor optical integrated device in which the DFB laser array 130 and the AWG 140 are monolithically integrated on the same substrate.

(Plane Structure)

Figure 2:
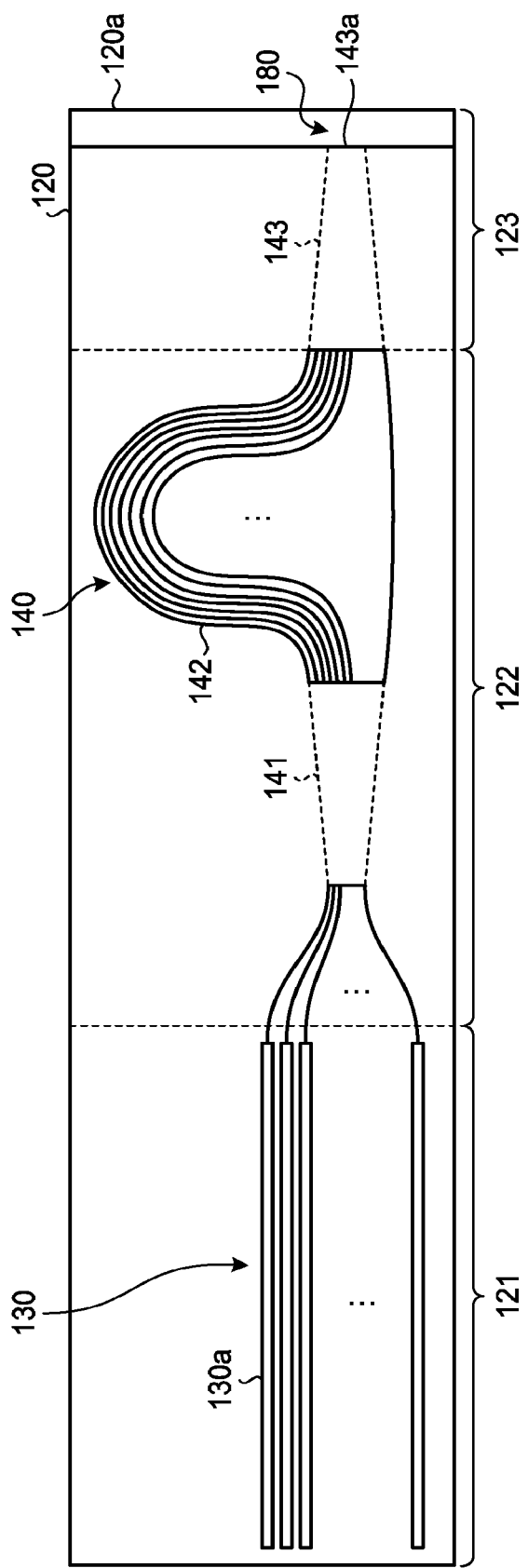
FIG. 2 is an enlarged view of a semiconductor optical integrated device of the semiconductor laser apparatus illustrated in FIG. 1.

FIG. 2 is an enlarged view of the semiconductor optical integrated device of the semiconductor laser apparatus illustrated in FIG. 1. Note that the schematic top view illustrated in FIG. 2 only depicts waveguides and omits patterns such as an electrode for simplification purposes.

As illustrated in FIG. 2, the semiconductor optical integrated device 120 according to the first embodiment includes a DFB laser array 130, an AWG 140, a facet window structure 180 including an output facet 120a of the semiconductor optical integrated device 120. The semiconductor optical integrated device 120 outputs a laser light L emitted from the DFB laser array 130 through the AWG 140 and the facet window structure 180 from the output facet 120a. Furthermore, the semiconductor optical integrated device 120 includes a buried waveguide unit 121, a mesa waveguide unit 122, and a buried waveguide unit 123. The buried waveguide unit 121 and the buried waveguide unit 123 constitute an area having a waveguide structure in which semiconductor cladding materials e buried near both sides of a waveguide core layer. The mesa waveguide unit 122 constitutes an area having a waveguide structure in which a semiconductor layer including at least a waveguide core layer and an upper cladding layer protrudes in a mesa format. Note that the waveguides of the mesa waveguide unit 122 of the first embodiment are high-mesa waveguides in which the part to the semiconductor layer including the waveguide core layer protrudes in a mesa format.

The DFB laser array 130 includes a plurality of DFB lasers 130a having different oscillation wavelengths. The number of DFB lasers 130a included in the DFB laser array 130 is, for example, 12. Note that, however, this number is not limited to 12. The DFB lasers 130a are designed to have oscillation wavelengths different from each other in a manner such that, for example, the oscillation wavelengths are included in a 1.55 μm wavelength band (1525 nm to 1610 nm) and different from each other by 3.5 nm. Note that, however, the oscillation wavelength band of the DFB laser array 130 is not limited to this example, and may have an oscillation wavelength band for another communication wavelength band. Furthermore, by changing the temperatures of the DFB lasers 130a, the oscillation wavelengths of the DFB lasers 130a vary. Thus, the DFB laser array 130 can be roughly adjusted by selecting one of the DFB lasers 130a and then, finely adjusted by changing the temperatures so as to operate as a wavelength-tunable light source that oscillates in a continuous wavelength range as a whole. Laser lights (laser light beams) L emitted from the respective DFB lasers 130a are guided to the waveguides connected to the DFB lasers 130a at an interval between the waveguides of 5 μm, and output to the AWG 140.

The AWG 140 is a semiconductor arrayed waveguide grating made of a semiconductor and includes an inputting slab waveguide 141 connected to the DFB laser array 130, an array waveguide 142 connected to the inputting slab waveguide 141, and an outputting slab waveguide 143 connected to the array waveguide 142.

Each of the inputting slab waveguide 141 and the outputting slab waveguide 143 is a waveguide that does not have a confinement structure that confines the lights in a layer surface direction which is along the surfaces of the layers, and thus the guided light input to the inputting slab waveguide 141 and output to the outputting slab waveguide 143 diffuses in the layer surface direction. In the AWG 140, the lights entering the inputting slab waveguide 141 spread and propagate in the inputting slab waveguide 141 as a light beam in the layer surface direction, and are coupled to the array waveguide 142. The lights emitted from the array waveguide 142 are collected as a light beam at the outputting slab waveguide 143 again, and output from an output end 143a of the outputting slab waveguide 143. Thus, the inputting slab waveguide 141 and outputting slab waveguide 143 of the AWG 140 do not necessarily confine the light beam in the layer surface direction.

The array waveguide 142 includes a plurality of waveguides having different lengths and arranged in a parallel manner, and the waveguides have respective light path length differences depending on the wavelengths. Thus, when guided lights having different wavelengths and emitted from the DFB lasers 130a are input to the positions of the inputting slab waveguide 141 corresponding to the light path length differences depending on the wavelengths, the guided lights are combined into the same light beam in the outputting slab waveguide 143.

Specifically, the array waveguide 142 includes 40 waveguides having a width of 2 μm and arranged at intervals of 3.5 μm, and has a focal length of 480 μm. In this example, the transmission wavelengths of the array waveguide 142 are designed so as to correspond to the oscillation wavelengths of the DFB lasers 130a. Thus, the laser light L emitted from each DFB laser 130a is collected at almost the same position on an output facet 120a of the semiconductor optical integrated device 120 by the wavelength selecting function of the AWG 140.

Note that, when the temperature of the whole TEC 110 is changed, the oscillation wavelengths of the DFB laser arrays 130 change and the transmission wavelengths of the AWG 140 change in substantially the same degree. Thus, the light collection position on the output facet 120a does not change.

The facet window structure 180 is formed between the outputting slab waveguide 143 and the output facet 120a, and does not have a light confinement structure in the layer surface direction, and thus has a structure in which a capability of confining light in the layer surface direction (i.e., in the vertical direction of the plane of FIG. 2) is less than that of the outputting slab waveguide 143. Specifically, the facet window structure 180 is formed by removing a waveguide core layer near the output facet 120a. By using the window structure, it is possible to prevent an occurrence of astigmatism between the layer surface direction and the layer direction when the beam is combined by a lens system after the chip is cleaved and the cleavage position deviates from the focal position of the beams in the layer surface direction of the AWG 140. Furthermore, the output facet 120a is provided with a low reflecting coating to reduce the reflectivity. The reflectivity can further be reduced by providing the facet window structure 180. Note that it is preferable that the length of the facet window structure 180 in a light waveguide direction in which the light is guided be greater than or equal to 10 μm and less than or equal to 20 μm in terms of the deviation of the cleavage position. Furthermore, the facet window structure 180 is formed so that the window structure starts from the position at which the beam is collected.

Note that the semiconductor optical integrated device 120 may not have the facet window structure 180. In such a case, the output facet 120a of the semiconductor optical integrated device 120 includes the output end 143a of the outputting slab waveguide 143. In other words, the laser light L output from the semiconductor optical integrated device 120 is directly output from the output end 143a of the outputting slab waveguide 143.

(Cross-Sectional Structure)

Figure 3:
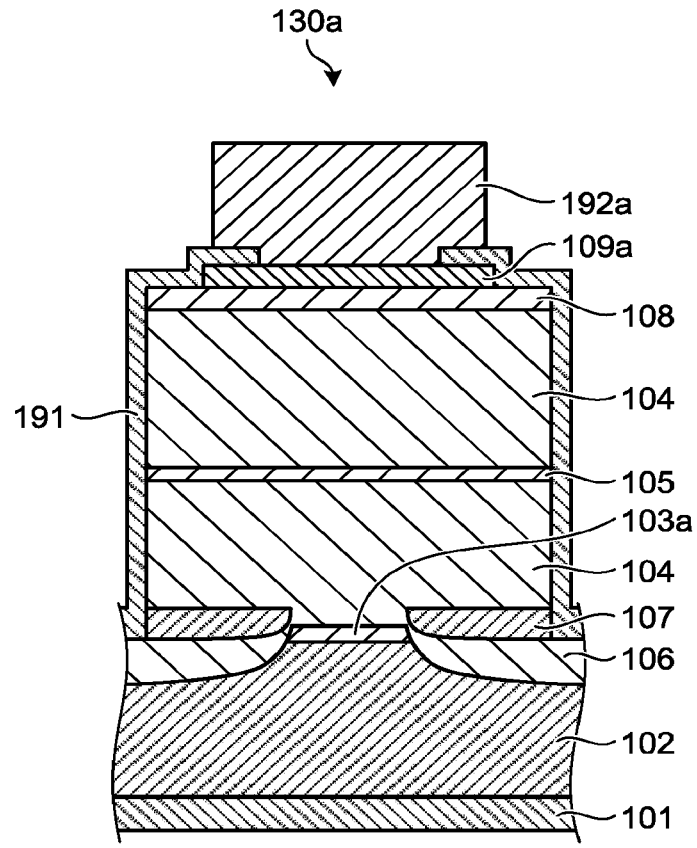
FIG. 3 is a schematic cross-sectional view of a DFB laser taken along a surface perpendicular to a waveguide.
Figure 4:
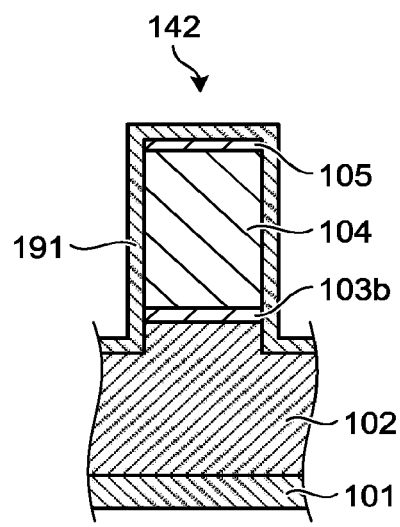
FIG. 4 is a schematic cross-sectional view of an AWG taken along a surface perpendicular to a waveguide.
Figure 5:
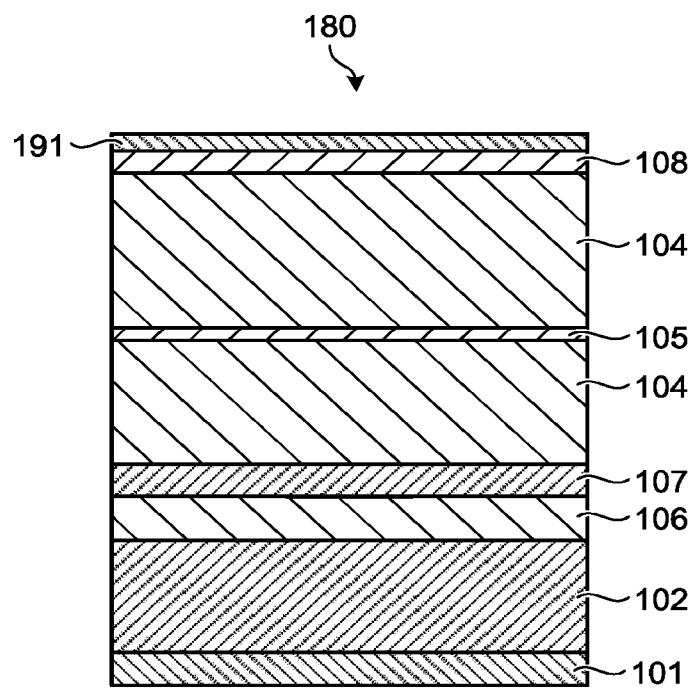
FIG. 5 is a schematic cross-sectional view of a facet window structure taken along a surface perpendicular to a waveguide.

FIGS. 3 to 5 are schematic cross-sectional views of the DFB laser 130a, an array waveguide 142, and a facet window structure 180 taken along the surfaces perpendicular to the waveguide, respectively.

(Cross-Sectional Structure: DFB Laser)

As illustrated in FIG. 3, the DFB laser 130a has a structure in which on a substrate 101 are sequentially layered a lower cladding layer 102, a waveguide core layer 103a, and an upper cladding layer 104. The material of the substrate 101 is InP, and the material of the lower cladding layer 102 is n-InP. Note that the material of the substrate 101 may be n-InP. When greater importance is given to the high frequency characteristic, an n electrode may be provided in the lower cladding layer 102 and the substrate 101 may be made of semi-insulating InP.

The waveguide core layer 103a is configured to be an active layer of a multiple quantum well structure made of GaInAsP that emits light by current injection. Meanwhile, on the upper surface of the waveguide core layer 103a is provided a diffraction grating layer (not illustrated). The waveguide core layer 103a including an SCH layer is 150 nm in thickness, and 1.7 μm in width.

The waveguide core layer 103a of the DFB laser 130a has a structure in which a lower buried cladding layer 106 and an upper buried cladding layer 107 are buried near both sides of the waveguide core layer 103a. The materials of the lower buried cladding layer 106 and the upper buried cladding layer 107 are p-InP and n-InP, respectively. The lower buried cladding layer 106 and the upper buried cladding layer 107 function as a current blocking layer, and increase the efficiency of the current injection to inject the current into the waveguide core layer 103a.

The upper cladding layer 104 is made of p-InP, and an etching stopping layer 105, which has a resistance to etching different from that of the upper cladding layer 104, is inserted in the upper cladding layer 104 in parallel to the surfaces of the layers. Note that the etching stopping layer 105 may be omitted depending on the manufacturing method. The thickness of the upper cladding layer 104 including the etching stopping layer 105 is 4.5 μm. Note that the thickness of the etching stopping layer 105 when the etching stopping layer 105 is inserted is, for example, 10 nm.

On the upper cladding layer 104 is provided a contact layer 108 being made of p-GaInAs and having a contact with a p electrode 109a. On the upper and side surfaces of the DFB laser 130a is appropriately formed a passivation film 191 made of SiNx such that the DFB lasers 130a next to each other are electrically separated from each other. Furthermore, the p electrode 109a has a contact with a wire 192a such as a bonding wire.

(Cross-Sectional Structure: Array Waveguide)

As illustrated in FIG. 4, the array waveguide 142 has a structure in which on the substrate 101 are sequentially layered a lower cladding layer 102, a waveguide core layer 103b, and an upper cladding layer 104. Note that the materials of the substrate 101, the lower cladding layer 102, and the upper cladding layer 104 are identical to the materials of the DFB laser 130a.

The waveguide core layer 103b has a bulk structure made of GaInAsP. The thickness and the width of the waveguide core layer 103b is 200 nm and 2.0 μm, respectively. The upper cladding layer 104 is 2.3 μm in thickness.

On the upper cladding layer 104 is provided the etching stopping layer 105. However, the etching stopping layer 105 may be removed. On the upper surface of the AWG 140 is appropriately formed a passivation film 191 made of SiNx.

(Cross-Sectional Structure: Facet Window Structure)

As illustrated in FIG. 5, the facet window structure 180 has a structure in which on the substrate 101 are sequentially layered the lower cladding layer 102, the lower buried cladding layer 106, the upper buried cladding layer 107, the upper cladding layer 104 into which the etching stopping layer 105 is inserted, and the contact layer 108. Note that the materials of the substrate 101, the lower cladding layer 102, the lower buried cladding layer 106, the upper buried cladding layer 107, the upper cladding layer 104, the etching stopping layer 105, and the contact layer 108 are identical to the materials of the DFB laser 130a.

As illustrated in FIG. 5, the facet window structure 180 does not include a waveguide core layer, instead, the lower buried cladding layer 106 and the upper buried cladding layer 107 are filled between the lower cladding layer 102 and the upper cladding layer 104. On the upper surface of the facet window structure 180 is formed a passivation film 191 made of SiNx. Note that, as illustrated in the comparison between FIG. 4 and FIG. 5, in the semiconductor optical integrated device 120, the height of the upper surface of the semiconductor of the facet window structure 180 is higher than the height of the upper surface of the semiconductor of the array waveguide 142. The facet window structure 180 has a low capability to confine a light in the layer direction and thus the light diffracts in the layer direction. When the diffracted light is reflected on the upper surface of the semiconductor of the facet window structure, the beam shape is misaligned. To prevent the misalignment, the upper surface of the semiconductor of the facet window structure 180 is preferably higher than the upper surface of the semiconductor of the array waveguide 142 in height.

Figure 6:
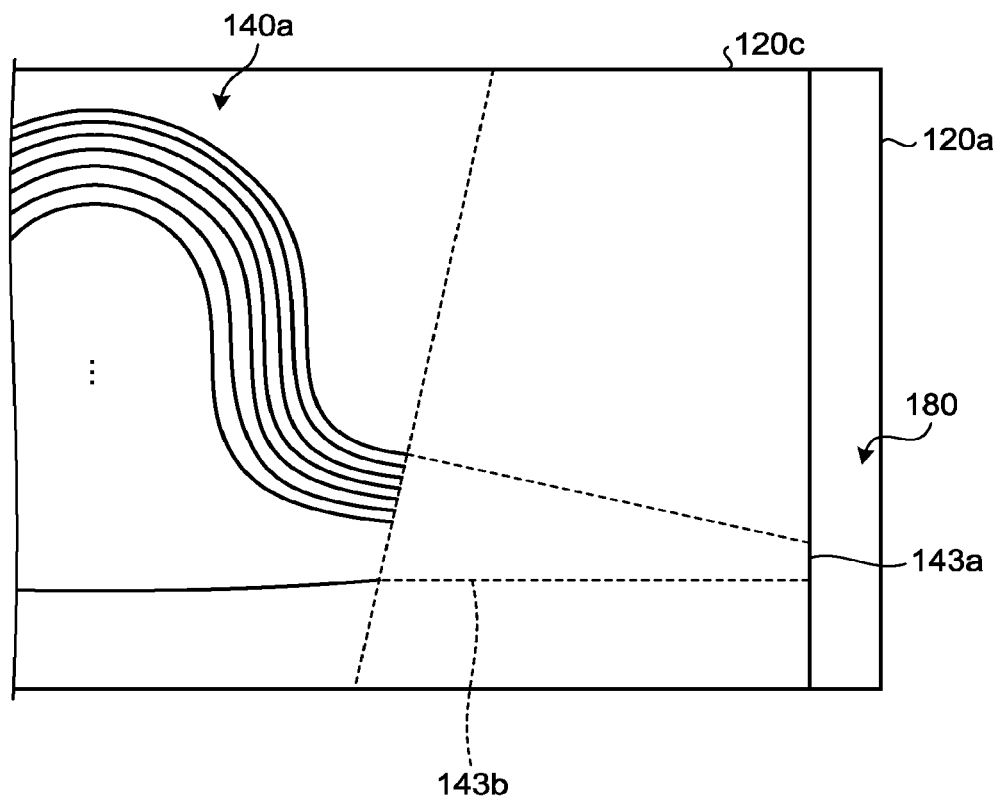
FIG. 6 is a view of an example of a light emitting slab waveguide that emits an emitted light in a direction inclined from an emission facet.

In the semiconductor optical integrated device 120 illustrated in FIG. 2, the light is emitted from the output facet 143a in a direction perpendicular to the output facet 143a and in a layer surface direction along the surfaces of the layers of the outputting slab waveguide 143. To more efficiently prevent the light reflected on the light emitting facet, an AWG 140a may be inclined toward the output facet 143a as a semiconductor optical integrated device 120c illustrated in FIG. 6 such that the light emitted from the output facet 143a is inclined from the direction perpendicular to the light emitting facet 143a in the layer surface direction along the surfaces of the layers of a slab waveguide 143b.

As illustrated in the cross-sectional structures described above, the DFB laser 130a has a buried waveguide structure and thus has an advantage that the speed of the surface recombination on the sides of the waveguide is reduced. Furthermore, the AWG 140 has a high-mesa waveguide structure and thus can reduce the radius of curvature and make the intervals of the waveguides close to each other. This can remarkably reduce the size of the apparatus.

With reference to FIG. 1 again, the light detector 150 detects the light output from a side of the DFB laser array 130 opposite to the output facet 120a and outputs an electric signal corresponding to the intensity of the detected light. The light detector 150 may be any device with a light detecting function, and may include, for example, a photodiode.

The lens 160 collects the laser light L output from the output facet 120a of the semiconductor optical integrated device 120. The lens 160 can couple the laser light L output by the semiconductor optical integrated device 120 to the optical fiber 170 at a low loss by adjusting the angle of the entering laser light L in the layer surface direction and the layer direction, and the position at which the entering laser light L propagates in the layer surface direction and the layer direction.

The optical fiber 170 is coupled to the laser light L collected by the lens 160, and guides and outputs the laser light L to the outside of the semiconductor laser apparatus 100.

Next, the operation of the semiconductor laser apparatus 100 will be described. First, any one of the DFB lasers 130a in the DFB laser array 130 is selected in accordance with a desired wavelength. Subsequently, the TEC 110 is set at a predetermined temperature such that the selected DFB laser 130a outputs the laser light L with the desired wavelength. Next, a current is injected into the selected DFB laser 130a such that the laser light L with the desired wavelength is output.

The laser light L output from the DFB laser array 130 enters the inputting slab waveguide 141 of the AWG 140. The entering light spreads and propagates as a beam in the inputting slab waveguide 141 in the layer surface direction, and is coupled to the array waveguide 142. The coupled light propagates in the array waveguide 142 and is collected as a beam again in the outputting slab waveguide 143. Meanwhile, the lights with different wavelengths emitted from the DFB lasers 130a are collected at the same position in the outputting slab waveguide 143 by the wavelength selecting function of the AWG 140. The light collected in the outputting slab waveguide 143 enters the facet window structure 180 and is output from the output facet 120a to the outside of the semiconductor optical integrated device 120 without being confined in the layer surface direction. The laser light L output by the semiconductor optical integrated device 120 is collected by the lens 160, coupled to the optical fiber 170, and output from the optical fiber 170 to the outside of the semiconductor laser apparatus 100.

When the optical coupler connected to the DFB laser array 130 does not have wavelength selectivity in this example, the output optical intensity of the light output by the semiconductor optical integrated device 120 is less than or equal to the output optical intensity of the light output from the DFB laser array 130 divided by the number of the DFB lasers. For example, when the number of DFB lasers of the DFB laser array 130 is eight, the output optical intensity of the light output by the semiconductor optical integrated device 120 is less than or equal to one eighth (12.5%) of the output optical intensity of the light output by the DFB laser array 130. On the other hand, in the semiconductor optical integrated device 120, the AWG 140 that transmits the lights of the DFB lasers 130a with different wavelengths with high efficiency is used as the optical coupler connected to the DFB laser arrays 130. As a result, the semiconductor laser apparatus 100 prevents the reduction in the output optical intensity of the light output by the semiconductor optical integrated device 120 and has high output efficiency.

Alternatively, when an output waveguide is connected to the outputting slab waveguide of the AWG 140, this reduces the tolerance to the manufacturing error. For example, the width of the waveguide is deviated by 400 nm, the thickness of the waveguide core layer is deviated by 23 nm, and the composition of the core converted to the wavelength is deviated by 42 nm from the desired values, respectively, as the manufacturing error, it can be estimated that the emission position at which the outputting slab waveguide emits light is deviated by five μm in the layer surface direction. This obviously increases the coupling loss between the outputting slab waveguide and the output waveguide with a width of approximately two μm.

On the other hand, the semiconductor laser apparatus 100 according to the first embodiment has a structure without an output waveguide and in which the lens 160 compensates the deviation of the output position at which the outputting slab waveguide 143 outputs light. The deviation of the output laser light L by five μm in the layer surface direction due to a manufacturing error corresponds to the adjustment of the angle of the lens 160 in the layer surface direction by 1.9 degrees. Thus, the lens 160 can sufficiently compensate the deviation. As described above, the semiconductor laser apparatus 100 can obtain a high coupling efficiency with a sufficient tolerance for light axis adjustment by combining the semiconductor optical integrated device 120 on which the AWG 140 without an output waveguide is integrated with the lens 160. Thus, the semiconductor laser apparatus 100 has a high tolerance to a manufacturing error.

Alternatively, when the existing waveguides are joined, in other words, when the outputting slab waveguide is joined to an output waveguide and the axis of the laser light L is adjusted in the direction of propagation and the AWG collects the light even slightly inside the output facet of the semiconductor optical integrated device, the waveguides sometimes collide with each other and are broken. Thus, the light axis can be adjusted and fixed only in a range in which a small gap exists between the waveguides. This adjustment adversely increases the connection loss. Especially, when semiconductor waveguides are used, the laser light L output from the output ends of the semiconductor waveguides are diffused at a wide angle and thus the small may cause a critical coupling loss. On the other hand, when the light axis is adjusted with a lens as the semiconductor laser apparatus 100, the light axis can be adjusted while the lens 160 is moved from zero toward a plus side or a minus side in the direction of propagation in which the laser light L propagates. As described above, the semiconductor laser apparatus 100 adjusts the light axis using a lens. This facilitates the light axis adjustment and can reduce the connection loss.

Note that, in the first embodiment, the inputting slab waveguide 141 and the outputting slab waveguide 143 face the same direction. Thus, when the patterning positions of the buried waveguide unit 121 and buried waveguide unit 123, and the mesa waveguide unit 122 deviate from the designed values for reasons of manufacture, the position at which the AWG 140 collects light is not changed. Furthermore, an output waveguide is not provided on the side facing the outputting slab waveguide 143 and the light is output directly from the output facet 120a. Thus, the deviation of the light collection position does not cause the decrease in output efficiency. The pattern deviation during manufacture is allowed to a significant extent. Thus, when the positions are deviated from the designed values by several μm, the output characteristic of the semiconductor laser apparatus 100 is not degraded. In other words, when the semiconductor laser apparatus 100 according to the first embodiment is manufactured in a method that may cause pattern deviation increasing the loss to an extent that is not allowed in the conventional method of connecting the existing buried waveguide unit and the mesa waveguide unit, the semiconductor laser apparatus 100 does not excessively causes a loss. As described above, the semiconductor laser apparatus 100 is highly tolerant to a manufacturing error, and outputs light with high efficiency.

(Manufacturing Method)

Next, a method for manufacturing the semiconductor optical integrated device 120 according to the first embodiment will be described. First, on the substrate 101 are sequentially layered the lower cladding layer 102, the waveguide core layer 103a of the DFB laser 130a, a part of the upper cladding layer 104, and the diffraction grating layer in an MOCVD method. The waveguide core layer 103a is a multiple quantum well structure made of GaInAsP, and the diffraction grating layer is made of GaInAs.

Next, an SiNx film is deposited on the whole surface of the diffraction grating layer and patterned in accordance with the periodic pattern of the diffraction grating of the diffraction grating layer formed on the DFB laser 130a. Subsequently, the diffraction grating layer is etched using the SiNx film as a mask. This etching forms a diffraction grating structure on the diffraction grating layer. After that, the SiNx film on the whole surface is removed and then an upper cladding layer 104 is layered with a diffraction grating buried growth in the MOCVD method.

An SiNx film is deposited on the whole surface of the upper cladding layer 104 again and a part of the SiNx film corresponding to the DFB laser 130a is patterned such that a pattern slightly wider than the DFB laser 130a is formed. Then, the upper cladding layer 104 is etched using the SiNx film as a mask, and the waveguide core layer in an area in which the AWG is to be formed is removed such that the lower cladding layer 102 is exposed. Subsequently, the mask of the SiNx film is used as a mask for selective growth to layer a waveguide core layer 103b and an upper cladding layer 104 of the AWG 140 in the MOCVD method.

Next, the mask of the SiNx film is removed, a new SiNx film is deposited and patterned such that the patterns corresponding to the DFB laser 130a and the waveguide of each connection unit are formed. In the formation, for the AWG 140 in which high-mesa waveguides is to be formed later and the waveguides of the connection units near the AWG 140, the patterns are formed wider than the width of the waveguide core layer. Meanwhile, the pattern at the part to be the facet window structure 180 is removed.

Subsequently, the etching using the SiNx film as a mask forms the DFB laser 130a and the mesa structure corresponding to the waveguide of each connection unit and exposes the lower cladding layer 102. Next, the mask of the SiNx film is used as a mask for selective growth to layer a lower buried cladding layer 106 and an upper buried cladding layer 107 on the exposed lower cladding layer 102 in the MOCVD method.

Next, the mask of the SiNx film is removed and an upper cladding layer 104, an etching stopping layer 105 with a thickness of 10 nm, an upper cladding layer 104, and a contact layer 108 are sequentially layered on the whole surface of the upper buried cladding layer 107 in the MOCVD method.

After that, the contact layer 108 is patterned such that the pattern covers a part except for the area on which high-mesa waveguides are to be formed. The pattern is used as a mask to remove the contact layer 108 made of p-GaInAs with etchant including sulfuric acid and hydrogen peroxide. Furthermore, the upper cladding layer 104 on the etching stopping layer 105 is removed by wet etching with muriatic etchant.

Next, an SiNx film is deposited on the whole surface and patterned such that openings are formed on the parts corresponding to both sides of the high-mesa waveguides. In the patterning, the periphery of the area of the DFB laser 130a is covered with the SiNx film, and openings are formed in the trench areas on the right and left sides of the DFB laser 130a.

Dry etching using the SiNx film as a mask forms a mesa structure by etching the etching stopping layer 105, upper cladding layer 104, waveguide core layer, and a part of lower cladding layer 102.

In the etching, the lower cladding layer 102 around the high-mesa structure is etched to a depth corresponding to a designed value. Meanwhile, the trench that electrically separates the DFB laser 130a is etched at least to a depth reaching the etching stopping layer 105 from the contact layer 108 through the upper cladding layer 104. Furthermore, the part except for the trench is covered and the trench is etched more deeply with muriatic etching.

After that, a passivation film 191 is formed on each part in a publicly known method and, for example, a p electrode 109a for current injection is formed on an opening in the passivation film 191. After the front side of the semiconductor optical integrated device 120 is processed, the substrate 101 is ground to a desired thickness and an electrode is formed on the reverse side of the semiconductor optical integrated device 120.

Furthermore, a facet is formed by the cleavage of the substrate, and the facet is coated and the elements are separated. Then, the method for manufacturing the semiconductor optical integrated device 120 is completed.

Note that, in the manufacturing method described above, the upper cladding layer 104 is deposited on the whole surface and then the area of the mesa waveguide unit is etched. However, the semiconductor optical integrated device 120 can be manufactured also in another manufacturing method, for example, using selective growth.

First Example

Next, the semiconductor laser apparatus 100 according to the first embodiment is manufactured as a first example and the output characteristic of the first example is compared to the output characteristic of a first comparative example. The semiconductor laser apparatus according to the first comparative example has a structure in which the AWG 140 of the semiconductor laser apparatus 100 is replaced by an MMI and the other components are identical to the components of the semiconductor laser apparatus 100.

Figure 7:
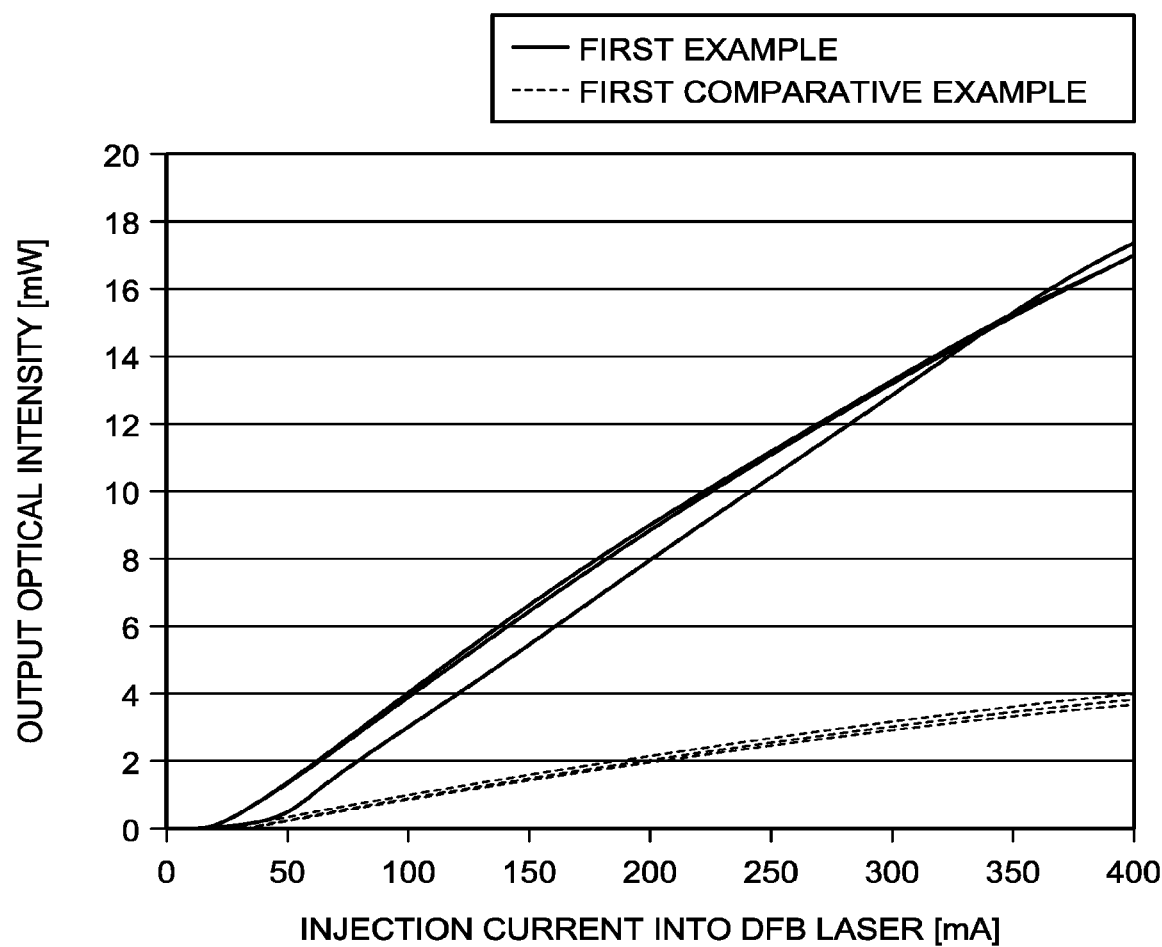
FIG. 7 is a view of comparison between the output characteristic of the semiconductor laser apparatus according to a first example and the output characteristic of a semiconductor laser apparatus according to a first comparative example.

FIG. 7 is a view of comparison between the output characteristic of a semiconductor laser apparatus according to the first example and the output characteristic of a semiconductor laser apparatus according to the first comparative example. FIG. 7 illustrates the output light intensities of the lights output from the semiconductor optical integrated device with respect to the injection current into the DFB laser. Furthermore, FIG. 7 illustrates the output light intensities of the lights with the longest wavelength, the shortest wavelength, and an around middle wavelength output from the DFB lasers among the 12 DFB lasers included in the DFB laser array in each of the first example and the first comparative example.

As illustrated in FIG. 7, all the DFB lasers 130a of the first example output lights with output light intensities approximately four times higher than the output light intensities of the lights output from the DFB lasers of the first comparative example. This is because the coupling loss due to the light coupler is improved by replacing the MMI with the AWG 140 in the first example. In other words, the comparison shows that the semiconductor laser apparatus 100 highly outputs light with high output efficiency.

Figure 8:
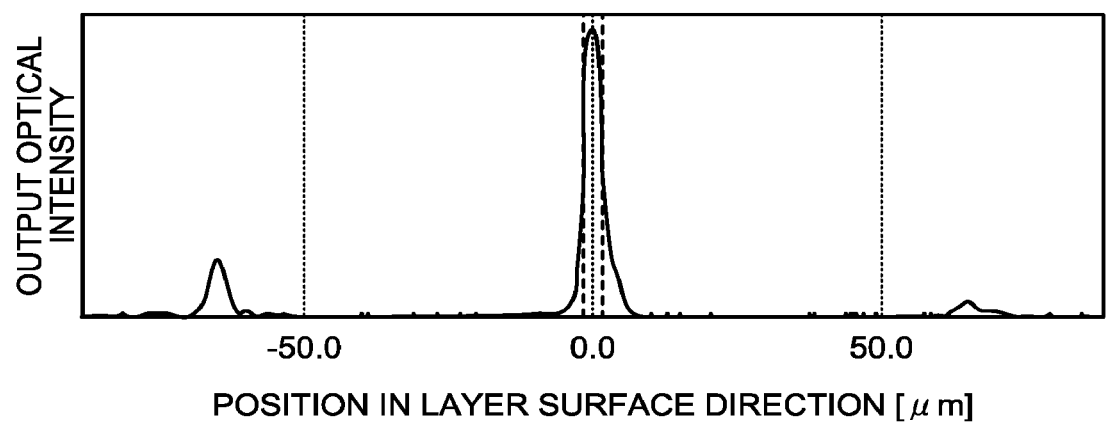
FIG. 8 is a drawing illustrating a distribution of an output optical intensity in a layer surface direction of the semiconductor laser apparatus according to the first example.

Next, the output optical intensity of the light output from the output facet 120a of the semiconductor optical integrated device 120 of the semiconductor laser apparatus 100 according to the first example in the layer surface direction and the layer direction is measured. FIG. 8 is a view of the distribution of the output optical intensity of the light output in the layer surface direction along the surfaces of the layers of the semiconductor laser apparatus according to the first example. In FIG. 8, the central peak is the output position at which the AWG 140 outputs a zero-order diffracted light, and right and left peaks are the output positions at which the AWG 140 outputs±first-order diffracted lights, respectively. The full width at half maximum of the zero-order diffracted light illustrated with a dashed line in FIG. 8 is 3.3 μm.

As described above, the zero-order peak sometimes deviates by approximately five μm in the layer surface direction (the horizontal direction of FIG. 8) due to a manufacturing error. This makes it extremely difficult to couple the output light to the output waveguide with a low loss. Furthermore, FIG. 8 depicts that a significant coupling loss occurs when the output light is connected to the output waveguide and the output light deviates by approximately one μm in the layer surface direction. On the other hand, the semiconductor laser apparatus 100 uses the lens 160 to compensate the deviation of the output light in the layer surface direction due to a manufacturing error, and thus prevents the increase in coupling loss. Thus, the semiconductor laser apparatus 100 is highly tolerant to a manufacturing error and have high output efficiency.

Figure 9:
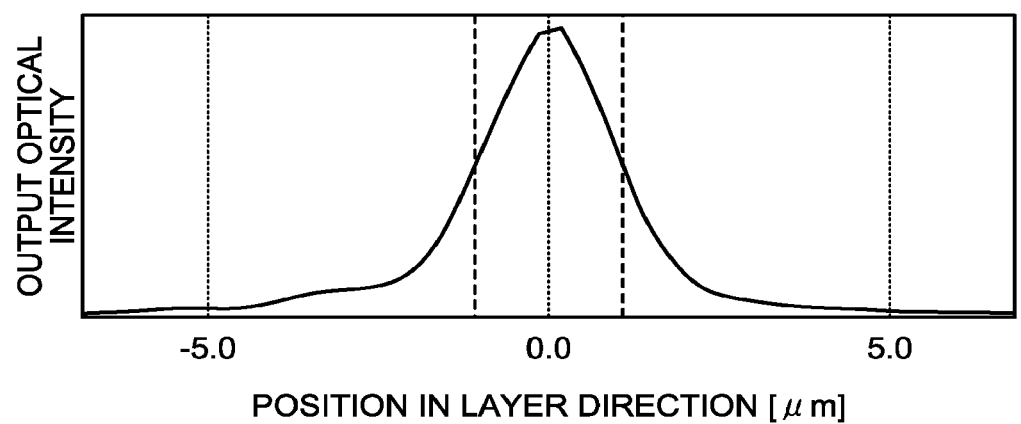
FIG. 9 is a drawing illustrating a distribution of an output optical intensity in a layer surface direction of the semiconductor laser apparatus according to the first example.

FIG. 9 is a view of the distribution of the output optical intensity of the light output in the layer direction in which the layers of the semiconductor laser apparatus according to the first example are layered. As illustrated in FIG. 9, the output optical intensity in the layer direction has a peak at the center. The full width at half maximum of the peak illustrated with a dashed line in FIG. 9 is 2.3 μm. As illustrated in FIGS. 8 and 9, a good single-peaked beam profile is obtained both in the layer surface direction and in the layer direction. Thus, the beam can be coupled to a fiber or a waveguide using a lens with high coupling efficiency.

As described above, the semiconductor laser apparatus 100 according to the first embodiment is highly tolerant to a manufacturing error and have high output efficiency.

Figure 10:
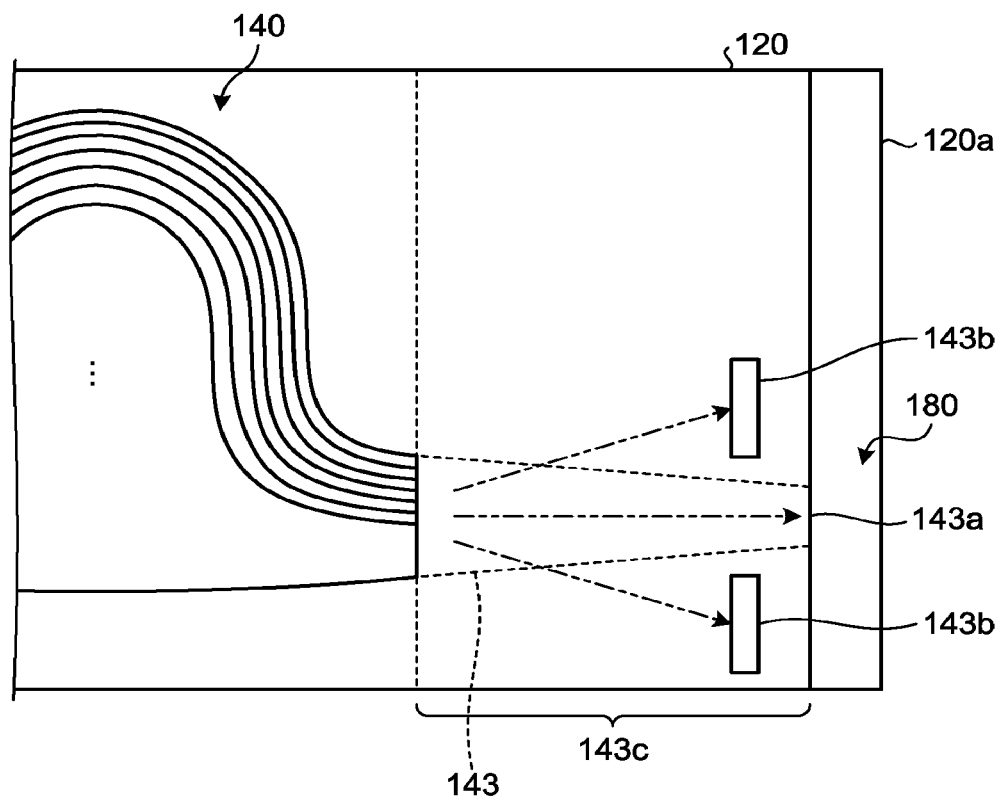
FIG. 10 is a drawing illustrating an example structure removing adjacent diffracted lights.

Note that, as illustrated in FIG. 8, the zero-order diffracted light having the highest optical intensity exists together with the adjacent±first-order diffracted lights. The adjacent diffracted lights become stray lights when being emitted from the semiconductor optical integrated device 120 without any processes, and may lead to a degradation of a characteristic of the semiconductor laser apparatus 100. In such a case, as illustrated in FIG. 10, structures 143b configured to remove the adjacent diffracted lights are provided in an area 143c in which the outputting slab waveguide 143 is provided. This can prevent the stray lights. In this example, the outputting slab waveguide 143 does not include the outer edge in the area 143c and is physically unified with the area 143c. Thus, the structures 143b configured to remove the adjacent diffracted lights may be placed at a position at which the structure 143b can remove the adjacent diffracted lights without blocking the zero-order diffracted light in the area 143c. The structure 143b configured to remove the adjacent diffracted lights may be a trench or hole having a depth deeper than the core of the outputting slab waveguide 143 and reaching the lower cladding layer. Alternatively, the structure 143b may be an absorbing layer capable of absorbing the adjacent diffracted light. Furthermore, the structures 143b configured to remove the adjacent diffracted lights may be provided not in the area 143c in which the outputting slab waveguide 143 is provided but in an area in which the facet window structure 180 is provided.

Second Embodiment

Figure 11:
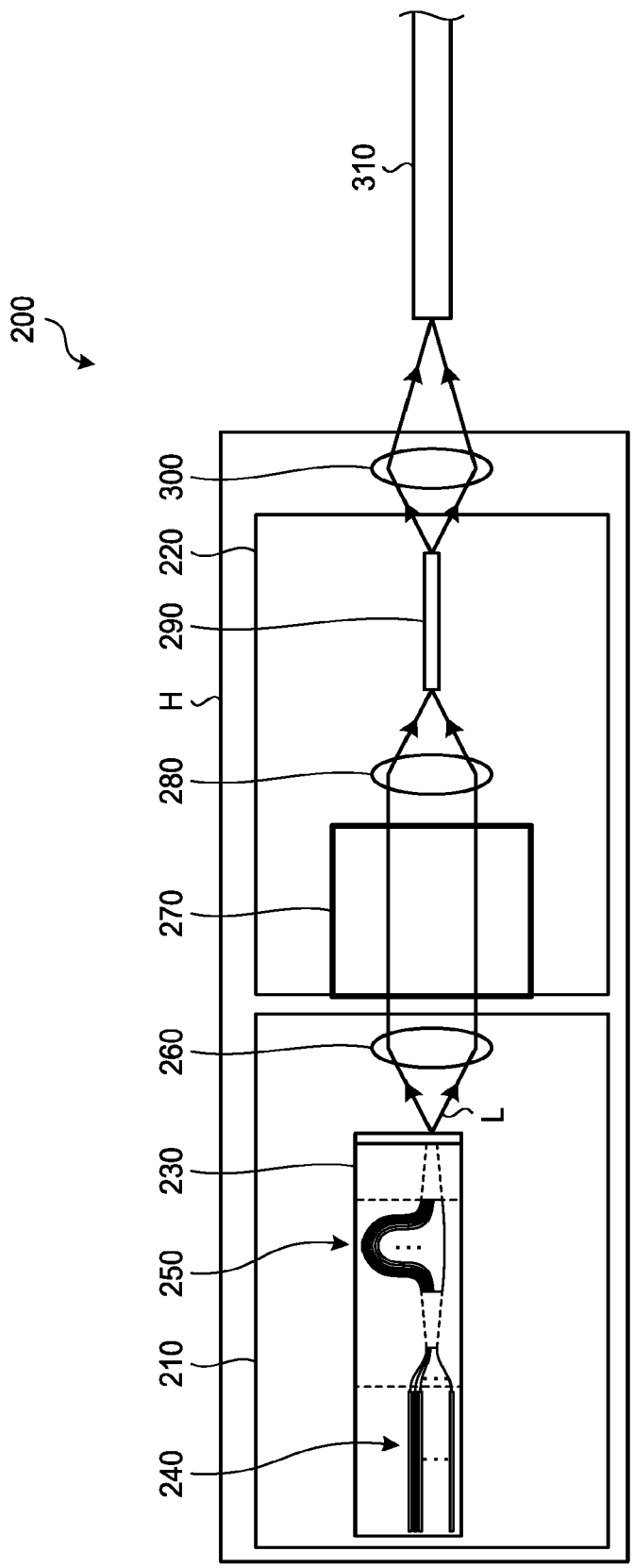
FIG. 11 is a schematic top view of a semiconductor laser apparatus according to a second embodiment.

Next, a semiconductor laser apparatus according to a second embodiment of the present disclosure will be described. FIG. 11 is a schematic top view of a semiconductor laser apparatus according to the second embodiment. As illustrated in FIG. 11, a semiconductor laser apparatus 200 according to the second embodiment includes a TEC 210 and a TEC 220 stored in a housing H. On the TEC 210 is placed a semiconductor optical integrated device 230. On the semiconductor optical integrated device 230 are integrated a DFB laser array 240 and an AWG 250. Furthermore, the semiconductor laser apparatus 200 includes a lens 260 that is a first lens, a wavelength monitor 270, a lens 280 that is a second lens, an SOA 290 that is a semiconductor optical amplifier placed on the TEC 220, a lens 300 that is a third lens, and an optical fiber 310. The TEC 210, TEC 220, the semiconductor optical integrated device 230, the lens 300, and the optical fiber 310 may have configurations identical to those in the first embodiment and the repeated descriptions are herein omitted.

The lens 260 is placed nearer to the semiconductor optical integrated device 230 than the lens 300 so as to collimate the laser light L output from the output facet of the semiconductor optical integrated device 230 and makes the laser light L an approximately collimated light.

The laser light L collimated by the lens 260 is input to the wavelength monitor 270 such that the wavelength monitor 270 detects the wavelength of the laser light L. The conditions for driving the DFB laser array 240 are changed while the detected wavelength is monitored. This can make the wavelength of the laser light L output from the semiconductor laser apparatus 200 a desired wavelength.

The lens 280 is placed nearer to the semiconductor optical integrated device 230 than the lens 300 so as to collect the laser light L output from the semiconductor optical integrated device 230 and passing through the wavelength monitor 270 and input to the lens 280. The lens 280 couples the laser light L output from the semiconductor optical integrated device 230 to the SCA 290 with a low loss.

The SOA 290 is a waveguide optical function element to which the laser light L collected by the lens 280 is input and that amplifies the input laser light L in accordance with the injected current and outputs the amplified laser light L.

Note that either the lens 260 and the wavelength monitor 270 or the lens 280 and the SOA 290 may be placed nearer to the semiconductor optical integrated device 230.

(Cross-Sectional Structure: SOA)

Figure 12:
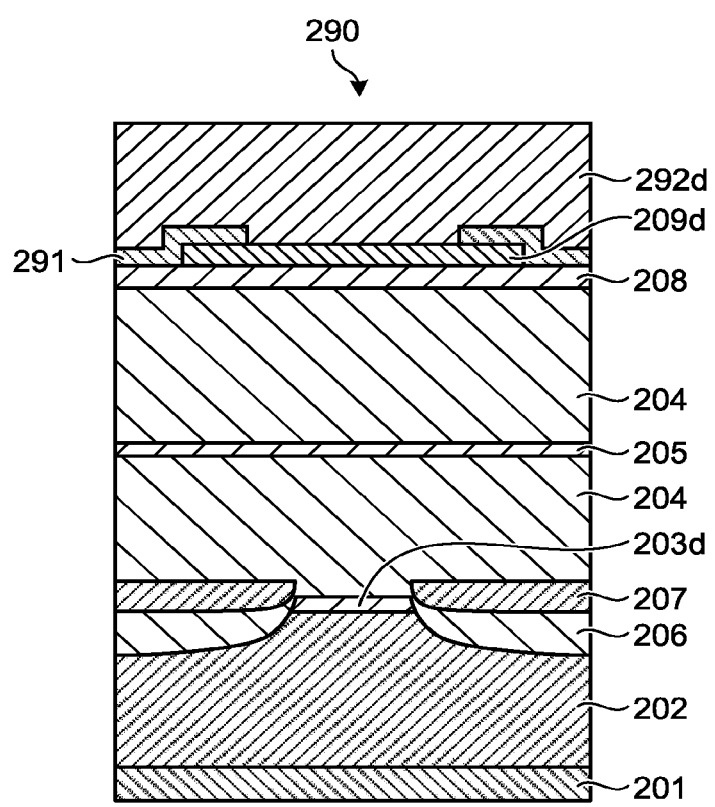
FIG. 12 is a schematic cross-sectional view of an SOA taken along a surface perpendicular to a waveguide.

FIG. 12 is a schematic cross-sectional view of the SOA taken along a surface perpendicular to the waveguide. As illustrated in FIG. 12, the SOA 290 has a structure in which on a substrate 201 are sequentially layered a lower cladding layer 202, a waveguide core layer 203d, and an upper cladding layer 204. Note that the materials of the substrate 201, the lower cladding layer 202, and the upper cladding layer 204 are identical to the materials of the DFB laser 130a.

The waveguide core layer 203d has a multiple quantum well structure made of GaInAsP that emits light by current injection. The waveguide core layer 203d including an SCH layer is 150 nm in thickness and is 1.7 µm in width.

Into the upper cladding layer 204 is inserted an etching stopping layer 205 having an etching resistance different from the etching resistance of the upper cladding layer 204. Similarly to the first embodiment, the etching stopping layer 205 can be omitted depending on the manufacturing method. The upper cladding layer 204 including the etching stopping layer 205 is 4.5 µm in thickness. Note that when the etching stopping layer 205 is inserted, the etching stopping layer 205 is, for example, 10 nm in thickness.

The waveguide core layer 203d of the SOA 290 has a waveguide structure in which a lower buried cladding layer 206 and an upper buried cladding layer 207 are buried near both sides of the waveguide core layer 103a of the DFB laser 130a. The materials of the lower buried cladding layer 206 and the upper buried cladding layer 207 are p-InP and n-InP, respectively. The lower buried cladding layer 206 and the upper buried cladding layer 207 function as a current blocking layer and increase the efficiency of the current injection to inject the current into the waveguide core layer 203d.

On the upper cladding layer 204 is provided a contact layer 208 made of p-GaInAs and having a contact with a p electrode 209d. On the upper surface of the SOA 290 is appropriately formed a passivation film 291 made of SiNx. Furthermore, the p electrode 209d has contact with a wire 292d such as a bonding wire.

Next, the operation of the semiconductor laser apparatus 200 will be described. First, any one of a plurality of DFB lasers in the DFB laser array 240 is selected in accordance with a desired wavelength. Subsequently, the TEC 210 is set at a predetermined temperature such that the selected DFB laser outputs the laser light L with the desired wavelength. Meanwhile, the TEC 220 is set at a predetermined temperature such that the SOA 290 has preferable amplification efficiency for the desired wavelength. Next, a current is injected into the selected DFB laser such that the laser light L with the desired wavelength is output. Meanwhile, a predetermined current is injected into the SOP, 290.

The laser light L output from the DFB laser array 240 enters the inputting slab waveguide of the AWG 250. The light entering the AWG 250 is output from a predetermined position in the outputting slab waveguide, and is output from the output facet of the semiconductor optical integrated device 230 through the facet window structure without being confined in a layer surface direction along the surfaces of the layers.

The light output from the semiconductor optical integrated device 230 is collimated by the lens 260 and input to the wavelength monitor 270. The wavelength monitor 270 detects the wavelength of the input laser light L. Based on the detected wavelength of the laser light L, the conditions for driving the DFB laser array 240, and the temperatures of the TEC 210 and TEC 220 are controlled in a feedback control. This feedback control enables the laser light L to have a predetermined wavelength.

The laser light L passing through the wavelength monitor 270 and input to the lens 280 is collected by the lens 280 and enters the SOA 290. The SOA 290 amplifies the laser light L entering in accordance with the injected current and outputs the amplified laser light L. The laser light L output from the SOA 290 is coupled to the optical fiber 310 by the lens 300 and output from the optical fiber 310 to the outside of the semiconductor laser apparatus 200.

In this example, the semiconductor laser apparatus 200 according to the second embodiment has a structure without an output waveguide and in which the lens 260, the lens 280, and the lens 300 compensate the deviation of the output position from the outputting slab waveguide. Thus, the lens 260, the lens 280, and the lens 300 can sufficiently compensate the deviation of the position of the output laser light L due to a manufacturing error of the semiconductor laser apparatus 200. Furthermore, the semiconductor laser apparatus 200 is designed to make the beam spot size of the semiconductor optical integrated device 230 identical to the beam spot size of the SOA 290 to decrease the reproduction ratio. The design can provide a high tolerance for positioning each lens in an optical axis direction. As described above, in the semiconductor laser apparatus 200, the semiconductor optical integrated device 230 on which the AWG 250 without an output waveguide is integrated is combined with the lens 260, the lens 280, and the lens 300. This combination provides high coupling efficiency with a sufficient tolerance for light axis adjustment. Thus, the semiconductor laser apparatus 200 has a high tolerance to a manufacturing error.

Note that the semiconductor laser apparatus 200 according to the second embodiment may have a structure without the wavelength monitor 270 and in which the output light collimated by the lens 260 is directly input to the lens 280. Alternatively, the positions of the wavelength monitor 270 and the SOA 290 may be switched such that the semiconductor optical integrated device 230, the lens 260, the lens 280, the SOA 290, another lens 260 used to collimate the light output from the SOA 290, the wavelength monitor 270, and the lens 300 are sequentially arranged.

Second Example

Next, as a second example and a second comparative example, the output light intensities when each of the semiconductor laser apparatuses of the first example and the first comparative example includes an SOA are measured. The semiconductor laser apparatus according to the second comparative example has a structure in which the AWG 250 of the semiconductor laser apparatus 200 is replaced with an MMI and the other components are identical to the components of the semiconductor laser apparatus 200.

Figure 13:
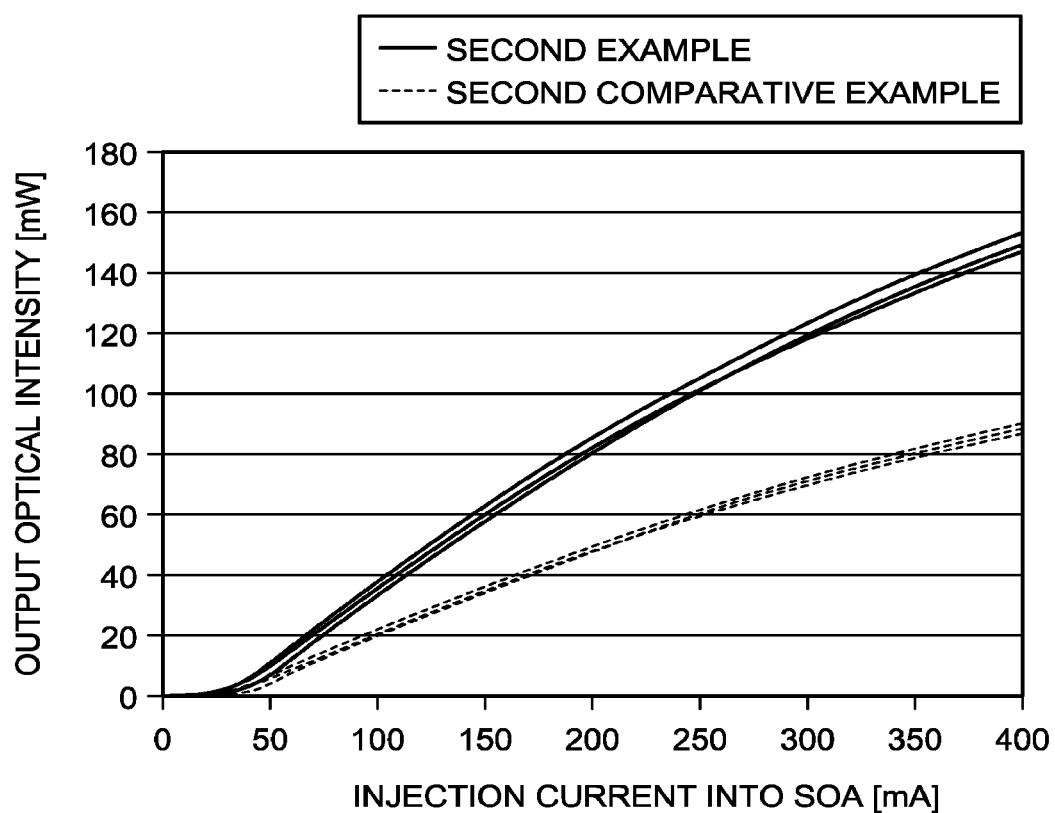
FIG. 13 is a drawing illustrating a comparison between output characteristics of a semiconductor laser apparatus according to a second example and output characteristics of a semiconductor laser apparatus according to a second comparative example.

FIG. 13 is a view of the comparison between the output characteristic of the semiconductor laser apparatus according to the second example and the output characteristic of the semiconductor laser apparatus according to the second comparative example. FIG. 13 is a view of the output light intensities of the lights output from the semiconductor laser apparatus with respective to the injection current into the SCA 290. Note that a constant current is injected into the DFB laser. Furthermore, FIG. 13 illustrates the output light intensities of the lights with the longest wavelength, the shortest wavelength, and an around middle wavelength output from the DFB lasers among the 12 DFB lasers included in the DFB laser array in each of the second example and the second comparative example.

As illustrated in FIG. 13, all the DFB lasers of the SOA 290 of the second example output the lights with the output light intensities approximately 1.7 times higher than the output light intensities of the lights output from the DFB lasers of the SOA of the second comparative example. This is because replacing the MMI with the AWG 250 improves the coupling loss due to the light coupler and thus the input optical intensity of the light input to the SOA 290 is increased in the second example. In other words, the semiconductor laser apparatus 200 highly outputs light with high output efficiency.

Thus, the semiconductor laser apparatus 200 according to the second embodiment is highly tolerant to a manufacturing error and has high output efficiency.

As described above, according to the present embodiment, the semiconductor laser apparatus that is highly tolerant to a manufacturing error and has high output efficiency can be provided.

Note that, although the DFB lasers output lights having different wavelengths, respectively, in the embodiment, the present disclosure is not limited to the embodiment. For example, a plurality of DFB lasers output lights having the same wavelength and thus a semiconductor laser apparatus can be configured to highly output light with a single wavelength. Alternatively, the DFB laser may be configured to output a signal light modulated by the supply of a modulated current, and may be provided with a constant current.

Furthermore, although the semiconductor laser element in the embodiment is a DFB laser, the present disclosure is not limited to the embodiment. For example, the semiconductor laser device may be a Distributed Reflector (DR) laser, or a Distributed Bragg Reflector (DBR) laser.

Furthermore, when the modules including two or more lenses are assembled with the semiconductor optical integrated device described in the embodiment, the output facet of the semiconductor optical integrated device and the lens placed next to the output facet are placed at the optimal positions for light axis adjustment in consideration of the balance with the waveguide (the optical fiber or the SOA with an SSC) coupled to another lens. When the semiconductor optical integrated device is appropriately designed, the light axis can be adjusted at the place where the beam spot side is increased, and thus the semiconductor optical integrated device can have a structure easy to assemble.

According to an embodiment of the present disclosure, the semiconductor laser apparatus can a higher tolerance to a manufacturing error and improve an output efficiency.

The present disclosure enables a semiconductor laser apparatus to have a high tolerance to a manufacturing error and high output efficiency.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser apparatus, comprising:
a semiconductor optical integrated device including:
  a semiconductor laser array including a plurality of semiconductor laser elements;
  a semiconductor arrayed waveguide grating, made of a semiconductor, including:
    an inputting slab waveguide connected to the plurality of the semiconductor laser elements;
    an array waveguide connected to the inputting slab waveguide and including a plurality of waveguides, each waveguide of the plurality of waveguides being arranged parallel to each other waveguide of the plurality of waveguides and each waveguide having a different length than that of each other waveguides of the plurality of waveguides; and
    an outputting slab waveguide connected to the array waveguide;
  a substrate on which the semiconductor laser array and the semiconductor arrayed waveguide grating are monolithically integrated; and
  an output facet configured to output a laser light emitted from the semiconductor laser elements, the output facet including an output end of the outputting slab waveguide, wherein
the outputting slab waveguide is tapered such that the outputting slab waveguide collects light received from the array waveguide toward the output facet.

2. The semiconductor laser apparatus according to claim 1, wherein the output end of the outputting slab waveguide includes a facet window structure part that is less capable of confining light in a layer direction in which layers of the output slab waveguide are layered than any other parts of the outputting slab waveguide.

3. The semiconductor laser apparatus according to claim 2, wherein a first height, relative to the substrate, of an upper surface of a semiconductor of the facet window structure part is higher than a second height, relative to the substrate, of an upper surface of a semiconductor of the semiconductor arrayed waveguide grating.

4. The semiconductor laser apparatus according to claim 1, wherein a light emitted from the output facet is inclined from a direction perpendicular to the output facet with respect to a layer surface direction extending along surfaces of layers of the outputting slab waveguide.

5. The semiconductor laser apparatus according to claim 1, further comprising:
a structure formed in an area where the outputting slab waveguide is provided, wherein
the structure is configured to remove an adjacent diffracted light emitted from the semiconductor arrayed waveguide grating.

6. The semiconductor laser apparatus according to claim 5, wherein the structure is a trench that is deeper than a core layer of the outputting slab waveguide and that reaches a lower cladding layer.

7. The semiconductor laser apparatus according to claim 1, further comprising:
a first lens configured to collect the laser light output from the output facet; and
an optical fiber configured to receive the laser light collected by the first lens and to guide and output the laser light to an outside of the semiconductor laser apparatus.

8. The semiconductor laser apparatus according to claim 1, further comprising:
a first lens configured to collect the laser light output from the output facet;

a waveguide optical function element configured to input the laser light collected by the first lens;

a second lens configured to collect the laser light output from the waveguide optical function element; and an optical fiber configured to receive the laser light collected by the second lens and to guide and output the laser light to an outside of the semiconductor laser apparatus.

9. The semiconductor laser apparatus according to claim 1, further comprising:

a first lens configured to collimate the laser light output from the output facet;

a wavelength monitor configured to input the laser light collimated by the first lens and detect a wavelength of the input laser light;

a second lens configured to collect the laser light passing through the wavelength monitor;

a waveguide optical function element configured to input the laser light collected by the second lens;

a third lens configured to collect the laser light output from the waveguide optical function element; and an optical fiber configured to receive the laser light collected by the third lens and to guide and output the laser light to an outside of the semiconductor laser apparatus.

10. The semiconductor laser apparatus according to claim 8, wherein the waveguide optical function element includes a semiconductor optical amplifier configured to amplify and output the laser light.

11. The semiconductor laser apparatus according to claim 9, wherein the waveguide optical function element includes a semiconductor optical amplifier configured to amplify and output the laser light.

12. The semiconductor laser apparatus according to claim 1, wherein a semiconductor laser element of the plurality of semiconductor elements is any one of a distributed feedback laser, a distributed reflector laser, and a distributed bragg reflector laser.

13. The semiconductor laser apparatus according to claim 2, wherein a light outputting surface of the facet window structure part is provided with a low reflecting coating.

* * * * *